(12) United States Patent
Yamaguchi et al.

(10) Patent No.: US 6,514,786 B1
(45) Date of Patent: Feb. 4, 2003

(54) METHOD OF MANUFACTURING ACCELERATION SENSOR

(75) Inventors: Yasuo Yamaguchi, Tokyo (JP); Teruya Fukaura, Fukuoka (JP); Kunihiro Nakamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/677,879

(22) Filed: Oct. 3, 2000

(30) Foreign Application Priority Data

Apr. 27, 2000 (JP) ........................................ 2000-127153

(51) Int. Cl.⁷ .............................................. H01L 21/00
(52) U.S. Cl. ........................................... 438/48; 438/49
(58) Field of Search ............................... 438/48, 49–53, 438/706; 257/226, 232–234, 414–418

(56) References Cited

U.S. PATENT DOCUMENTS 6,287,885 B1 * 9/2001 Muto et al. ................... 438/48

* cited by examiner

*Primary Examiner*—David Nelms
*Assistant Examiner*—Dung A Le
(74) *Attorney, Agent, or Firm*—Oblon, Spivak, McClelland, Maier & Neustadt, P.C.

(57) ABSTRACT

Provided is a method of manufacturing an acceleration sensor capable of preventing bonding of a movable electrode and a fixed electrode. A stain film 8 for reducing bonding adsorption force is formed on side surfaces of a movable electrode 1, fixed electrodes 2a and 2b and a frame portion 7. In the case in which the movable electrode 1 and the fixed electrodes 2a and 2b are to be formed of a silicon substrate, it is preferable that an insulating film having irregular bonding of silicon atoms and oxygen atoms and irregular bonding of silicon atoms and nitrogen atoms should be employed for the stain film 8, for example. The formation of the stain film 8 can suppress the bonding between the movable electrode 1 and the fixed electrodes 2a and 2b even if Coulomb force is generated between both electrodes when the silicon substrate and a back side substrate 4 are joined by using an anode junction method.

1 Claim, 10 Drawing Sheets

METHOD OF MANUFACTURING ACCELERATION SENSOR

BACKGROUND OF THE INVENTION

1. Field of the Invention

The present invention relates to a method of manufacturing an acceleration sensor having a fixed electrode and a movable electrode to be displaced according to an acceleration and serving to measure an acceleration based on a change in an electrostatic capacity between both electrodes.

2. Description of the Background Art

Figure 13:
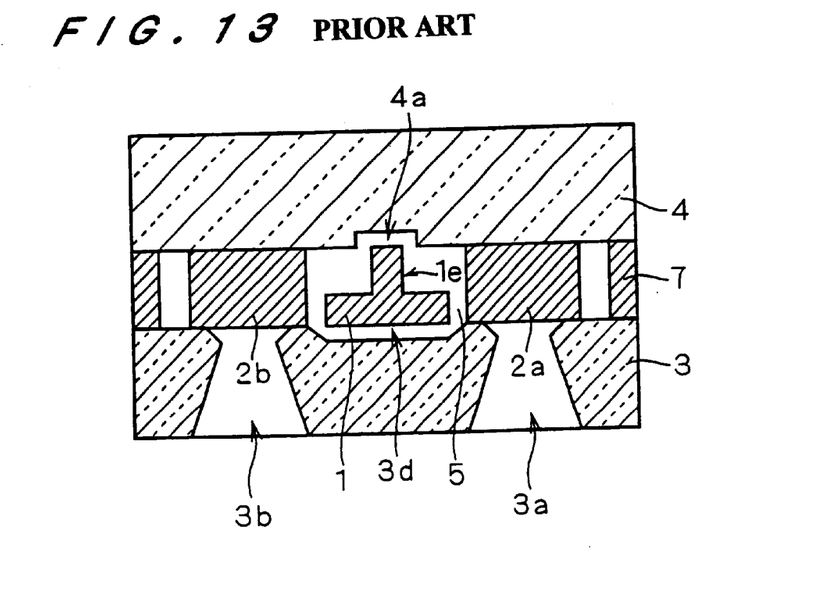
FIG. 13 is a sectional view showing a structure of the acceleration sensor.

FIG. 13 is a sectional view showing an example of a structure of an acceleration sensor. The acceleration sensor comprises fixed electrodes 2a and 2b, a movable electrode 1, a surface side substrate 3, a back side substrate 4 and a frame portion 7.

The movable electrode 1 is displaced upon receipt of an acceleration. Accordingly, respective distances between the movable electrode 1 and the fixed electrodes 2a and 2b are changed. The change is detected as a variation in the electrostatic capacitance. Thus, the acceleration sensor converts the acceleration into an electric signal.

Figure 14:
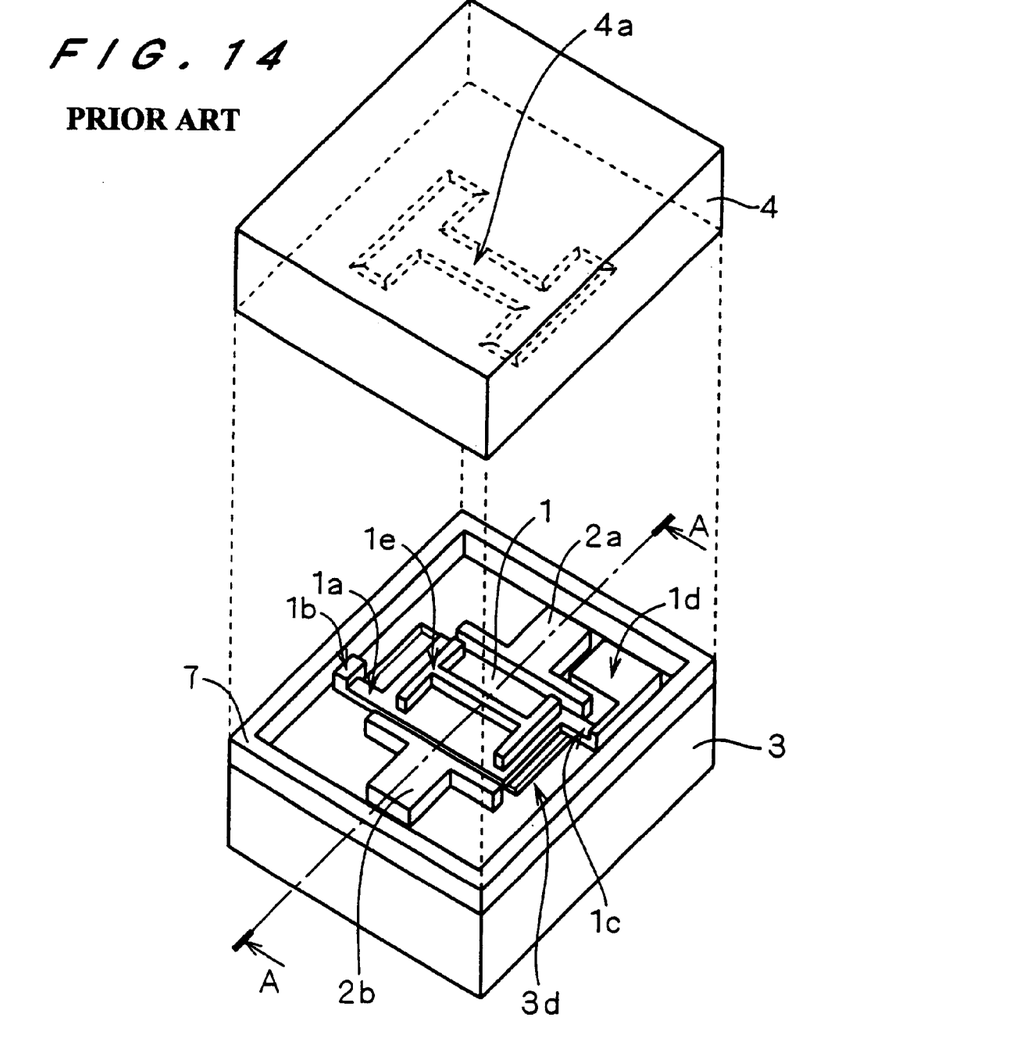
FIGS. 14 and 15 are perspective views showing the structure of the acceleration sensor.
Figure 15:
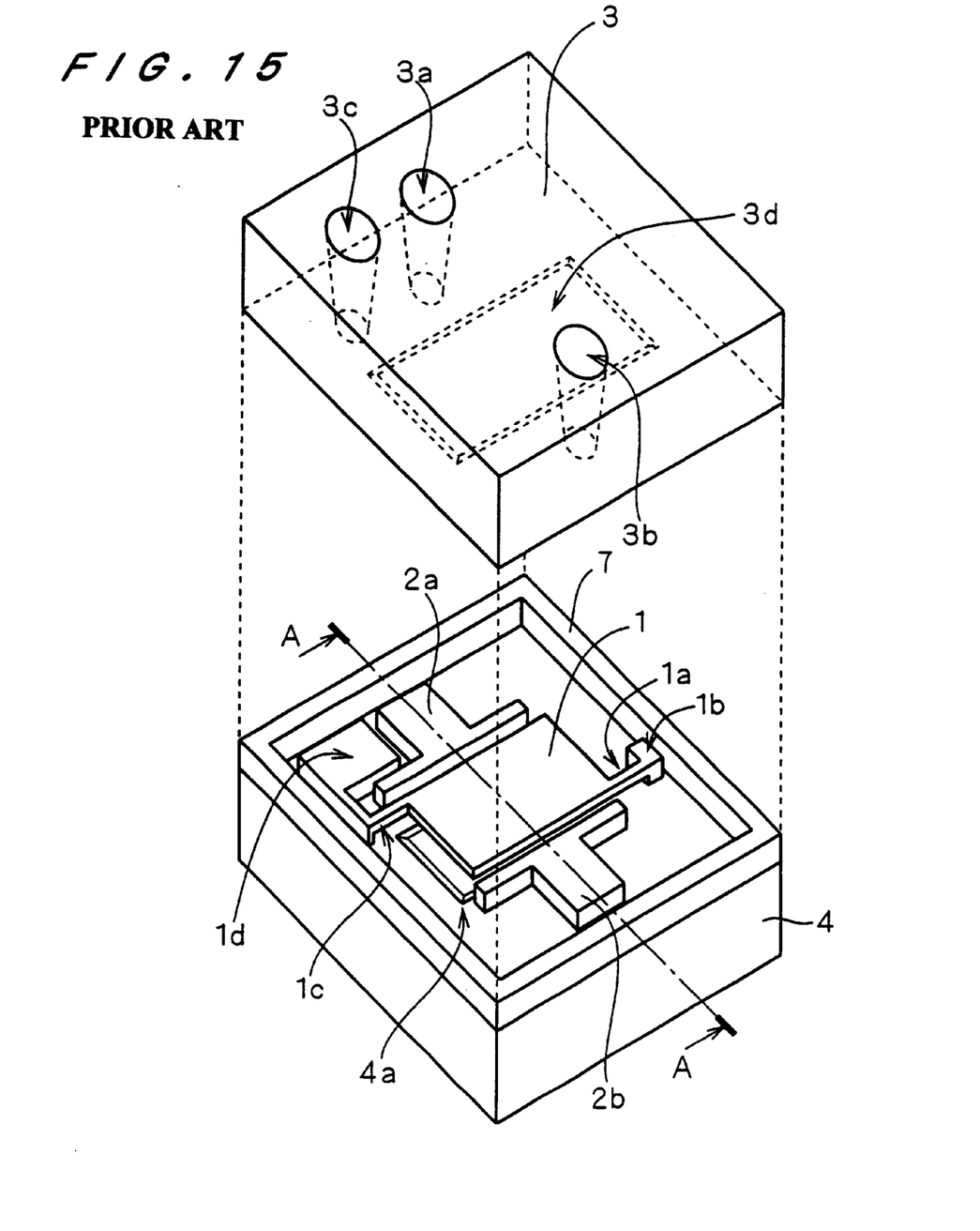
Figure 16:
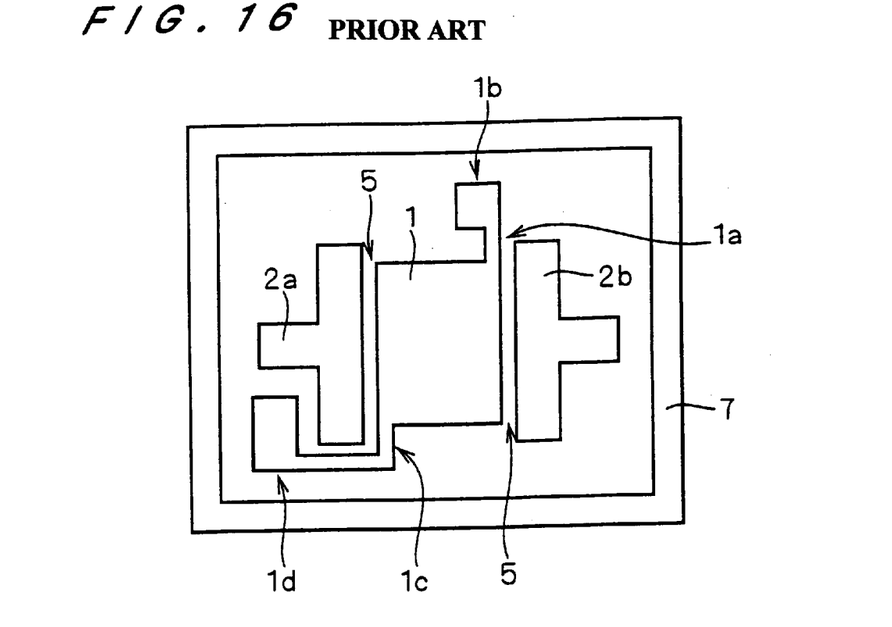
FIG. 16 is a plan view showing the structure of the acceleration sensor.

Moreover, FIGS. 14 and 15 are perspective views showing the acceleration sensor seen from the surface and back sides, respectively. FIG. 13 is a sectional view taken along the line A—A in FIGS. 14 and 15. In order to clearly illustrate an internal structure of the acceleration sensor, the back side substrate 4 and the surface side substrate 3 are separated from the acceleration sensor in FIGS. 14 and 15, respectively. Furthermore, FIG. 16 is a plan view showing the fixed electrodes 2a and 2b, the movable electrode 1 and the frame portion 7 in which the surface side substrate 3 is separated from the acceleration sensor.

As shown in FIGS. 13 to 16, the movable electrode 1 takes the shape of a rectangular parallelepiped having an H-shaped projection 1e on one surface. Then, beam-shaped portions 1a and 1c are extended from a set of opposite sides of the rectangular parallelepiped and the beam-shaped portions 1a and 1c are connected to movable electrode support portions 1b and 1d, respectively.

The projection 1e is provided on the movable electrode 1 for the following reason. The weight of the movable electrode 1 should be reduced to increase a sensitivity to the acceleration, and furthermore, the distance between the back side substrate 4 and the movable electrode 1 should not be greatly increased as compared with the distance between the surface side substrate 3 and the movable electrode 1.

The movable electrode support portions 1b and 1d are joined to the back side substrate 4 and the surface side substrate 3, and the movable electrode 1 is maintained in a floating state by the joined portions and the beam-shaped portions 1a and 1c. The back side substrate 4 and the surface side substrate 3 are provided with concave portions 4a and 3d such that the back side substrate 4 and the surface side substrate 3 do not come in contact with the movable electrode 1, respectively.

Moreover, the fixed electrodes 2a and 2b and the frame portion 7 are also joined to the back side substrate 4 and the surface side substrate 3. The movable electrode 1 is provided to be interposed between the two fixed electrodes 2a and 2b. The movable electrode 1 is not in contact with the two fixed electrodes 2a and 2b through a void 5.

The surface side substrate 3 is provided with contact holes 3a and 3b to be connected to the fixed electrodes 2a and 2b respectively and a contact hole 3c to be connected to the movable electrode support portion 1d. Electric potentials of the respective electrodes are detected from the contact holes 3a to 3c. Then, a change in an electrostatic capacity is detected between the electrodes. Only one fixed electrode can also be operated in the same manner. In that case, it is enough that the surface side substrate 3 should be provided with the contact hole 3a or 3b and the contact hole 3c.

A method of manufacturing the acceleration sensor will be described below.

First of all, a silicon substrate for forming the movable electrode 1, the fixed electrodes 2a and 2b and the frame portion 7 and two glass substrates to be the surface side substrate 3 and the back side substrate 4 are prepared. The contact holes 3a to 3c and the concave portion 3d are formed in one glass substrate and the concave portion 4a is formed in another glass substrate. Thus, the surface side substrate 3 and the back side substrate 4 are formed.

In the silicon substrate, moreover, patterns of the movable electrode 1, the beam-shaped portions 1a and 1c, the movable electrode support portions 1b and 1d, the fixed electrodes 2a and 2b and the frame portion 7 are formed from the side of the surface side substrate 3 to the middle of a thickness of the substrate (corresponding to a thickness of the movable electrode 1) by using a photolithographic technique and an anisotropic etching technique.

Figure 17:
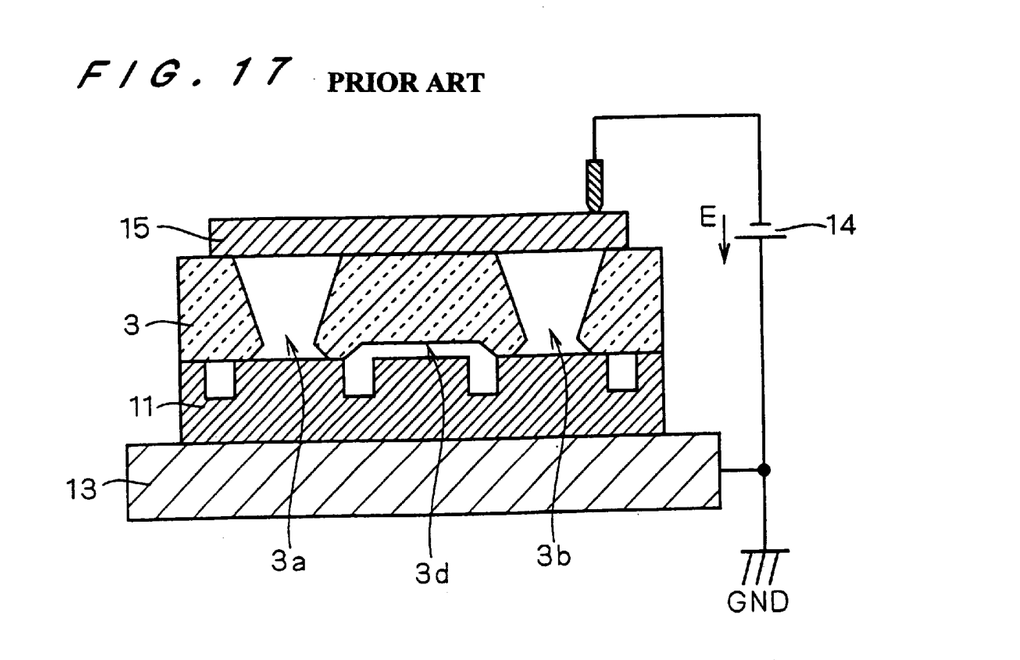
FIGS. 17 to 20 are diagrams showing a conventional method of manufacturing an acceleration sensor.

Next, the silicon substrate and the surface side substrate 3 are joined to each other by using an anode junction method. As shown in FIG. 17, the silicon substrate 11 and the surface side substrate 3 are provided in alignment, and electrodes 13 and 15 are connected thereto and are heated, respectively. When a temperature suitable for the anode junction method is reached, a voltage is applied to the electrodes 13 and 15. At this time, a ground potential GND is applied to the electrode 13 connected to the silicon substrate 11, and an electric potential which is lower than the ground potential GND by an electric potential difference E is applied to the electrode 15 connected to the surface side substrate 3. In order to generate the electric potential difference E, it is preferable that a DC power supply 14 should be connected to the electrodes 13 and 15. By properly regulating the value of the electric potential difference E, a time required for application thereof, a temperature for junction and the like, a junction current is caused to flow to both electrodes so that the silicon substrate 11 and the surface side substrate 3 can be joined to each other.

Next, the voltage application is stopped and the electrodes 13 and 15 are removed from the silicon substrate 11 and the surface side substrate 3. By using the photolithographic technique and the anisotropic etching technique, the patterns of the projection 1e of the movable electrode 1, the movable electrode support portions 1b and 1d, the fixed electrodes 2a and 2b and the frame portion 7 are formed in a surface of the silicon substrate 11 which is opposite to the surface side substrate 3. Consequently, the movable electrode 1 is brought into a floating state.

Figure 18:
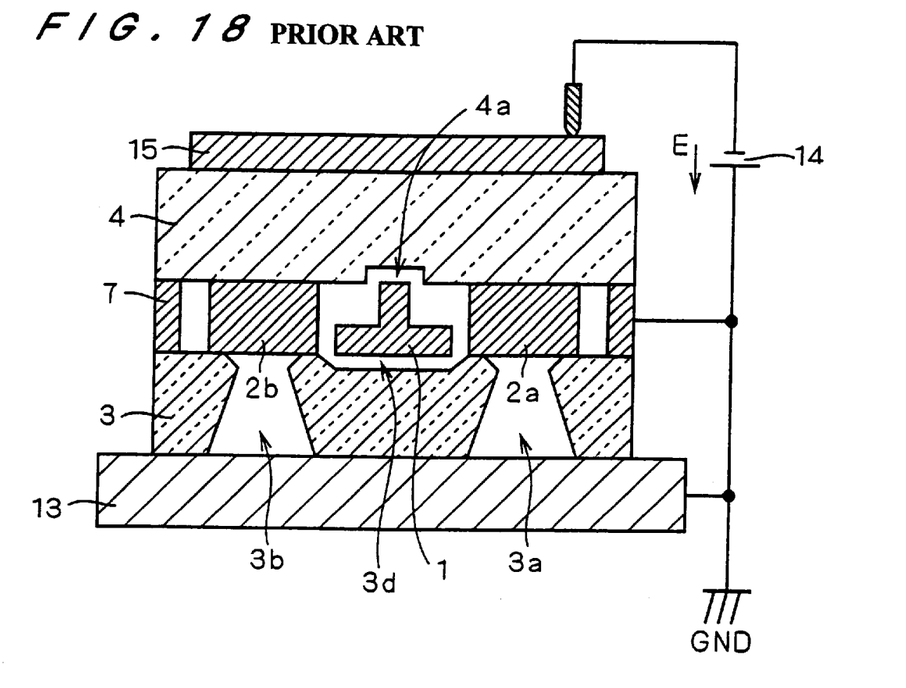

Then, the anode junction method is used again to join the silicon substrate 11 to the back side substrate 4. As shown in FIG. 18, the silicon substrate 11 having the movable electrode 1, the fixed electrodes 2a and 2b and the frame portion 7 formed thereon and the back side substrate 4 are provided in alignment, and electrodes 13 and 15 are connected to the surface side substrate 3 and the back side substrate 4 and are heated, respectively. When a temperature suitable for the anode junction method is reached, a voltage is applied to the electrodes 13 and 15. At this time, a ground potential GND is applied to the electrode 13 connected to the surface side substrate 3, and an electric potential which is lower than the ground potential GND by the electric potential difference E is applied to the electrode 15 connected to the back side substrate 4. The same electric potential as that of the electrode 13 is applied to the frame portion 7 in the silicon substrate 11. By properly regulating the value of the electric potential difference E, a time required for application thereof, a temperature for junction and the like, a junction current is caused to flow to both electrodes so that the silicon substrate 11 and the back side substrate 4 can be joined to each other.

Figure 19:
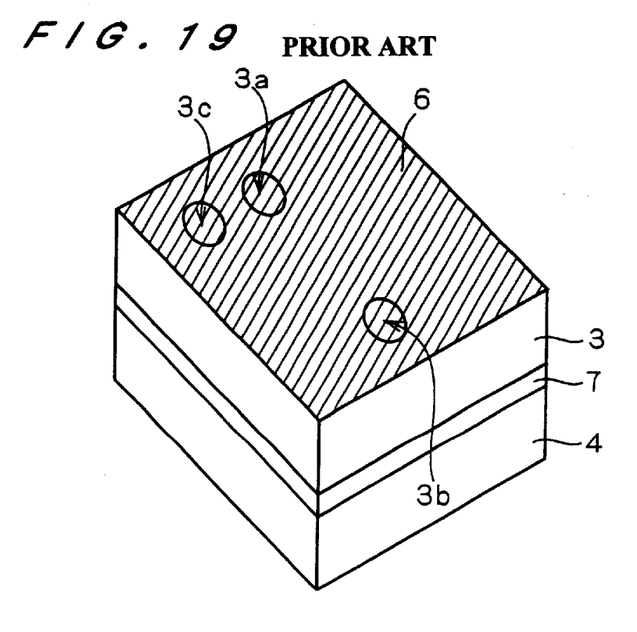

As shown in FIG. 19, then, a metal film 6 is formed over the whole surface of the surface side substrate 3 by using a sputtering method or the like. At this time, the metal film 6 is formed sufficiently thickly such that electrical connection can be attained between the metal film 6 and the movable electrode 1 and the fixed electrodes 2a and 2b in the contact holes 3a to 3c.

Figure 20:
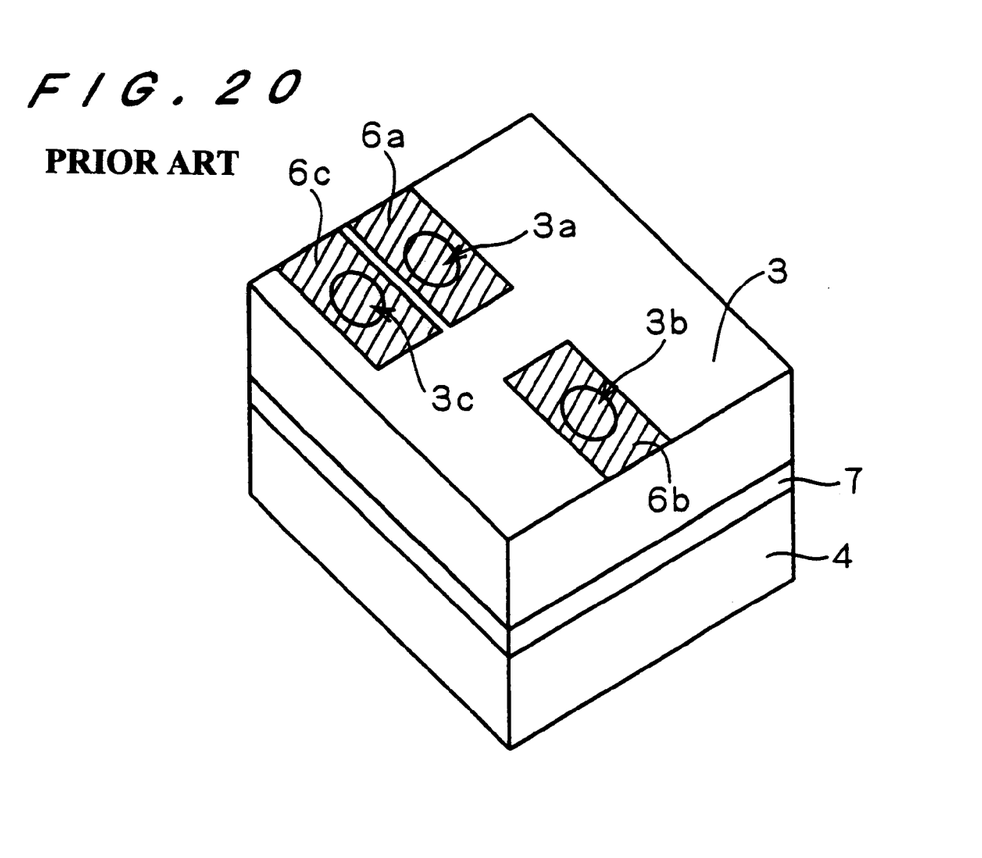

As shown in FIG. 20, finally, the metal film 6 is subjected to patterning by using the photolithograpic technique and an etching technique and is divided into electrode films 6a, 6b and 6c connected to the fixed electrodes 2a and 2b and the movable electrode 1, respectively.

In the above-mentioned anode junction method, when the silicon substrate 11 and the back side substrate 4 are to be joined to each other, the movable electrode 1 and the fixed electrodes 2a and 2b are set in an electrical floating state because the movable electrode 1 and the fixed electrodes 2a and 2b are separated from the frame portion 7. For this reason, the movable electrode 1 and the fixed electrodes 2a and 2b are brought into an electrically unstable state so that an electric potential difference is easily made between the movable electrode 1 and the fixed electrodes 2a and 2b. In the anode junction method, usually, the value of the electric potential difference E is set to approximately 300 to 1000 V. In some cases, therefore, an electric potential difference of approximately several tens V is made between the movable electrode 1 and the fixed electrodes 2a and 2b.

A distance between the movable electrode 1 and the fixed electrodes 2a and 2b is designed to be approximately several $\mu$m. For this reason, when the electric potential difference of approximately several tens V is made between the movable electrode 1 and the fixed electrodes 2a and 2b, Coulomb force (electrostatic attractive force) for attraction is generated so that both electrodes are bonded to each other. Such a phenomenon deteriorates the yield of the acceleration sensor so that the cost of the acceleration sensor cannot be reduced.

SUMMARY OF THE INVENTION

In order to solve the above-mentioned problem, it is an object of the present invention to provide a method of manufacturing an acceleration sensor which can prevent a movable electrode and a fixed electrode from being bonded to each other.

A first aspect of the present invention is directed to a method of manufacturing an acceleration sensor comprising the steps of (a) preparing first and second insulating substrates and a non-insulating substrate, (b) joining the first insulating substrate and the non-insulating substrate and forming a movable electrode and a fixed electrode in the non-insulating substrate by using a photolithographic technique and an anisotropic etching technique, (c) forming a first film for reducing bonding adsorption force through electrostatic attractive force on surfaces of the movable electrode and the fixed electrode which are opposed to each other, and (d) joining, by using an anode junction method, the second insulating substrate on a surface of the non-insulating substrate which is opposite to a surface where the first insulating substrate is joined without causing the movable electrode to come in contact with the second insulating substrate.

A second aspect of the present invention is directed to the method of manufacturing an acceleration sensor according to the first aspect of the present invention, wherein the non-insulating substrate is a silicon substrate and the first film is an insulating film having irregular bonding of silicon atoms and oxygen atoms and irregular bonding of silicon atoms and nitrogen atoms.

A third aspect of the present invention is directed to the method of manufacturing an acceleration sensor according to the second aspect of the present invention, wherein the surfaces of the movable electrode and the fixed electrode which are opposed to each other are immersed in a mixed solution of a hydrogen fluoride solution and a nitric acid solution, thereby forming the first film at the step (c).

A fourth aspect of the present invention is directed to the method of manufacturing an acceleration sensor according to the second aspect of the present invention, wherein the surfaces of the movable electrode and the fixed electrode which are opposed to each other are immersed in a diluted nitric acid solution and is then immersed in a hydrogen fluoride solution, thereby forming the first film at the step (c).

A fifth aspect of the present invention is directed to a method of manufacturing an acceleration sensor comprising the steps of (a) preparing first and second insulating substrates and a non-insulating substrate, (b) joining the first insulating substrate and the non-insulating substrate and forming a movable electrode and a fixed electrode in the non-insulating substrate by using a photolithographic technique and an anisotropic etching technique, (c) forming, on a surface of the second insulating substrate, a second film for causing an eutectic reaction with the non-insulating substrate when it is heat treated at a predetermined temperature, and (d) carrying out a heat treatment at the predetermined temperature without causing the movable electrode to come in contact with the second film and joining, through the second film, the second insulating substrate on a surface of the non-insulating substrate which is opposite to a surface where the first insulating substrate is joined.

A sixth aspect of the present invention is directed to the method of manufacturing an acceleration sensor according to the fifth aspect of the present invention, wherein the non-insulating substrate is a silicon substrate and the second film is a layered film of a titanium film and a nickel film.

A seventh aspect of the present invention is directed to the method of manufacturing an acceleration sensor according to the sixth aspect of the present invention, wherein the step (c) includes the steps of (c1) forming a photoresist on a surface of the second insulating substrate at a side where the non-insulating substrate is joined, (c2) patterning the photoresist, (c3) forming a titanium film and a nickel film on the second insulating substrate and the photoresist, and (c4) lifting off the titanium film and the nickel film formed on the photoresist.

An eighth aspect of the present invention is directed to the method of manufacturing an acceleration sensor according to the seventh aspect of the present invention, wherein the photoresist is positive and the lift-off is carried out by immersing the titanium film and the nickel film in an acetone solution at the step (c4).

A ninth aspect of the present invention is directed to a method of manufacturing an acceleration sensor comprising the steps of (a) preparing first and second insulating substrates and a non-insulating substrate, (b) providing at least two contact holes on the first insulating substrate, (c) joining the first insulating substrate to the non-insulating substrate and forming, in the non-insulating substrate, a movable electrode and a fixed electrode which are to be connected to the contact holes respectively by using a photolithographic technique and an anisotropic etching technique, (d) forming a conductive film on the first insulating substrate and in the contact holes such that the movable electrode and the fixed electrode are conducted through the contact holes, (e) joining, by an anode junction method, the second insulating substrate to a surface of the non-insulating substrate which is opposite to a surface where the first insulating substrate is joined while applying a predetermined electric potential to the conductive film, and (f) patterning the conductive film to be divided into electrode films connected to the fixed electrode and the movable electrode, respectively.

According to the first aspect of the present invention, the first film for reducing bonding adsorption force through electrostatic attractive force is formed on the surfaces of the movable electrode and the fixed electrode which are opposed to each other. At the step (d), therefore, even if the electrostatic attractive force is generated between both electrodes, it is possible to suppress the bonding of the movable electrode and the fixed electrode.

According to the second aspect of the present invention, the first film is an insulating film having irregular bonding of silicon atoms and oxygen atoms and irregular bonding of silicon atoms and nitrogen atoms. Therefore, the bonding is caused with difficulty because the surface of the insulating film has a large number of concave and convex portions. Moreover, the existence of the nitrogen atoms suppresses the generation of the bonding still more.

According to the third aspect of the present invention, it is possible to form an insulating film having irregular bonding of silicon atoms and oxygen atoms and irregular bonding of silicon atoms and nitrogen atoms.

According to the fourth aspect of the present invention, it is possible to form an insulating film having irregular bonding of silicon atoms and oxygen atoms and irregular bonding of silicon atoms and nitrogen atoms.

According to the fifth aspect of the present invention, the second film for causing an eutectic reaction with the non-insulating substrate when it is heat treated at a predetermined temperature is formed on the surface of the second insulating substrate. Consequently, it is possible to join the second insulating substrate and the non-insulating substrate without using the anode junction method.

According to the sixth aspect of the present invention, the second film is a layered film of a titanium film and a nickel film. Therefore, when the silicon substrate is provided on the layered film and is heat treated at a predetermined temperature, the silicon atoms and the nickel atoms cause an eutectic reaction. Accordingly, it is possible to join the second insulating substrate and the non-insulating substrate without using the anode junction method.

According to the seventh aspect of the present invention, when the photoresist is subjected to proper patterning, it is possible to prevent a layered film from being formed in a portion of the second insulating substrate corresponding to the arrangement of the movable electrode.

According to the eighth aspect of the present invention, the lift-off is carried out by immersing the titanium film and the nickel film in an acetone solution. Consequently, the photoresist can be removed without corroding the nickel film. Therefore, the eutectic reaction of the nickel film and the silicon substrate is not prevented. Moreover, since the photoresist is positive, it is easily dissolved in acetone.

According to the ninth aspect of the present invention, the conductive film is formed on the first insulating substrate and in the contact hole such that the movable electrode and the fixed electrode are conducted through the contact holes. At the step (e), therefore, the movable electrode and the fixed electrode have the same electric potential and the bonding of the movable electrode and the fixed electrode is not caused. Differently from the conventional art, only the order of the steps is exchanged. Therefore, another film does not need to be formed. Consequently, an increase in a cost can be prevented.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

In a method of manufacturing an acceleration sensor according to the present embodiment, a film for reducing bonding adsorption force is formed on faces of a movable electrode and a fixed electrode which are opposed to each other. Also in the present embodiment, description will be given by taking, as an example, a structure of an acceleration sensor shown in FIGS. 13 to 16.

Figure 1:
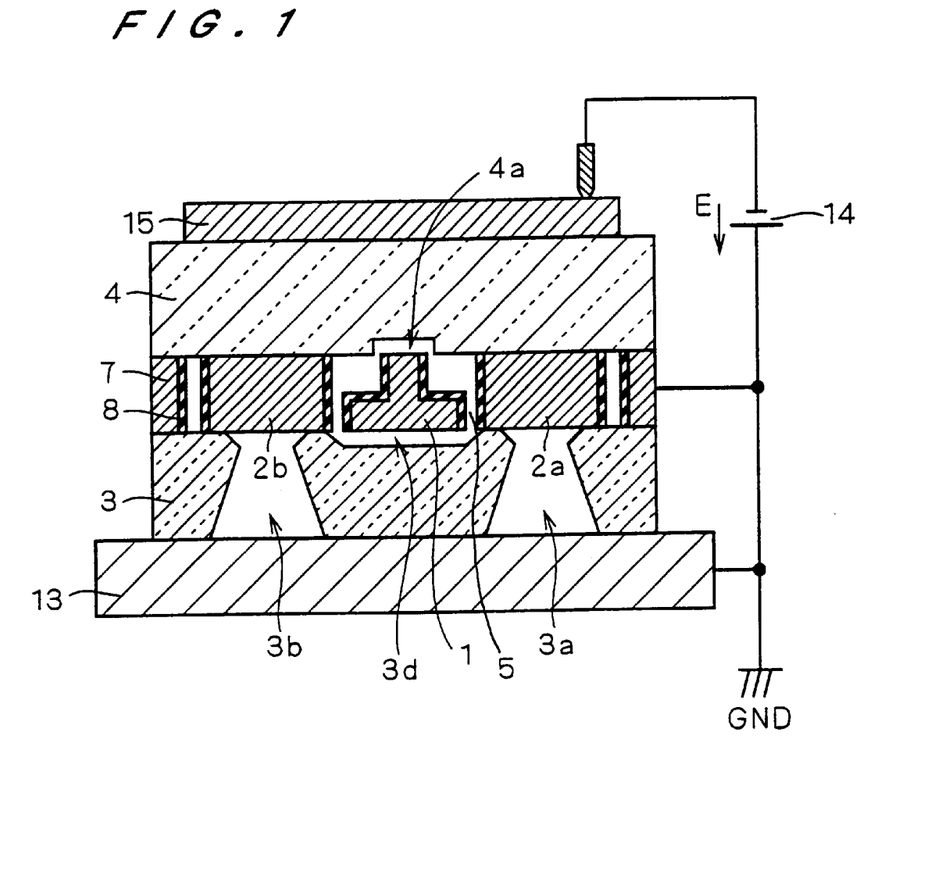
FIGS. 1 to 5 are diagrams showing a method of manufacturing an acceleration sensor according to a first embodiment.

FIG. 1 shows the step of joining a silicon substrate to a back side substrate 4 by using an anode junction method in the method of manufacturing an acceleration sensor according to the present embodiment. Before the state shown in FIG. 1 is obtained, a surface side substrate 3 having contact holes 3a to 3c and a concave portion 3d formed therein and a silicon substrate are joined by using the anode junction method and a movable electrode 1, fixed electrodes 2a and 2b and a frame portion 7 are formed in the silicon substrate in the same manner as in the conventional art. Moreover, the back side substrate 4 having a concave portion 4a formed therein is also prepared.

In FIG. 1, a stain film 8 for reducing the bonding adsorption force is formed on side surfaces of the movable electrode 1, the fixed electrodes 2a and 2b and the frame portion 7. The formation of the stain film 8 can prevent bonding between the movable electrode 1 and the fixed electrodes 2a and 2b even if Coulomb force is generated between both electrodes when the silicon substrate and the back side substrate 4 are to be joined by using the anode junction method. Accordingly, after voltage application is stopped, the movable electrode 1 and the fixed electrodes 2a and 2b are separated from each other so that a void 5 can be held between both electrodes.

In the case in which the movable electrode 1 and the fixed electrodes 2a and 2b are to be formed of the silicon substrate, it is preferable that an insulating film having irregular bonding of silicon atoms and oxygen atoms and that of silicon atoms and nitrogen atoms should be employed for the stain film 8, for example. Such an insulating film has a large number of concave and convex portions on a surface thereof. Therefore, the bonding is caused with difficulty. Moreover, the existence of the nitrogen atoms suppresses the generation of the bonding still more.

The step of forming the stain film 8 will be described below in detail. First of all, the surface side substrate 3 and the silicon substrate 11 which are joined using the anode junction method are prepared. Before the junction to the surface side substrate 3, a pattern 12a of the movable electrode 1, beam-shaped portions 1a and 1c, movable electrode support portions 1b and 1d, the fixed electrodes 2a and 2b and the frame portion 7 is formed in the silicon substrate 11 from the side of the surface side substrate 3 to the middle of a thickness of the silicon substrate 11 (corresponding to a thickness of the movable electrode 1).

Then, an oxide film 9 is formed on a surface of the silicon substrate 11 by using a thermal oxidation method, a CVD (Chemical Vapor Deposition) method or the like.

Figure 2:
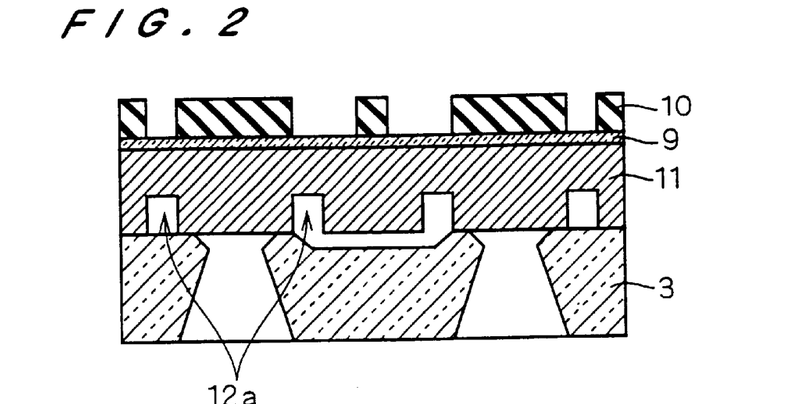
Figure 3:
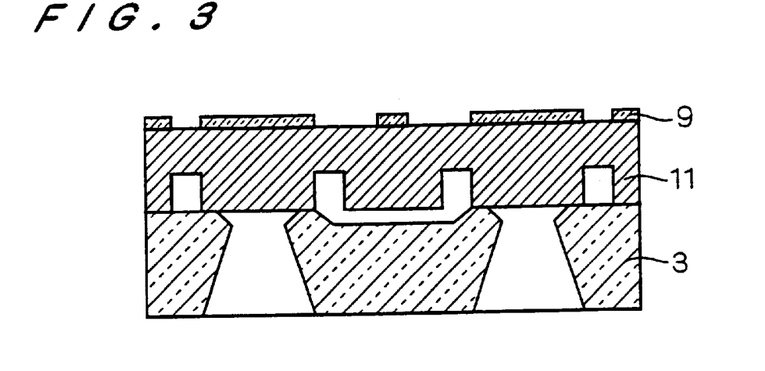

Next, a photoresist 10 is formed on the oxide film 9 and is subjected to patterning to act as a mask for patterns of a projection 1e of the movable electrode 1, the movable electrode support portions 1b and 1d, the fixed electrodes 2a and 2b and the frame portion 7 (FIG. 2). Then, the oxide film 9 is etched with a hydrogen fluoride solution or the like through the photoresist 10, and is subjected to the same patterning as that in the photoresist 10. Thereafter, the photoresist 10 is removed (FIG. 3).

Figure 4:
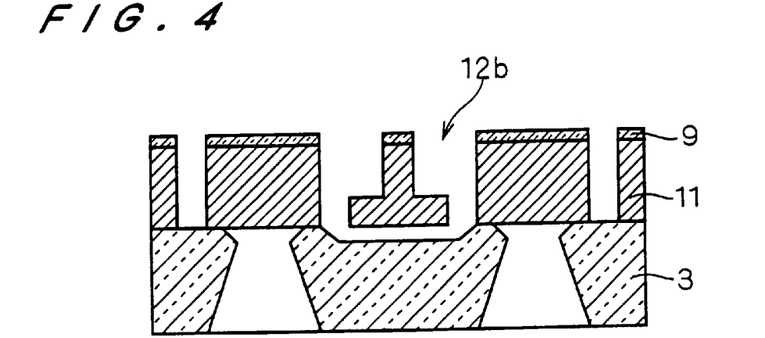

Subsequently, the silicon substrate 11 is subjected to anisotropic etching such as RIE (Reactive Ion Etching) by using the oxide film 9 as a mask. Then, a pattern 12b for the projection 1e of the movable electrode 1, the movable electrode support portions 1b and 1d, the fixed electrodes 2a and 2b and the frame portion 7 is formed on the silicon substrate 11 (FIG. 4). Consequently, the movable electrode 1 is brought into a floating state.

Figure 5:
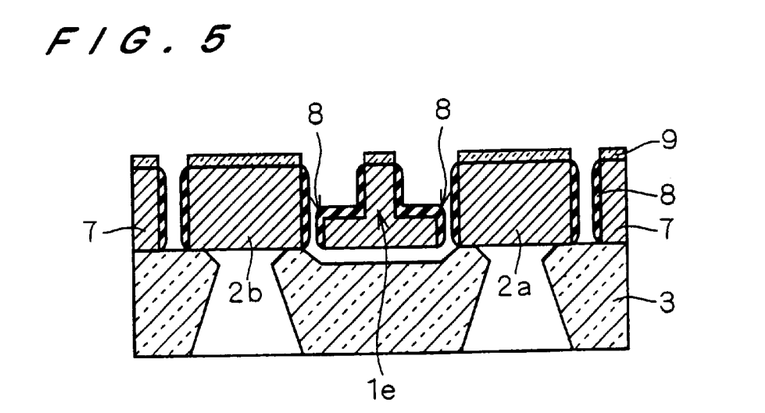

Then, each of the movable electrode 1, the beam-shaped portions 1a and 1c, the movable electrode support portions 1b and 1d, the fixed electrodes 2a and 2b and the frame portion 7 is immersed in a mixed solution in which a small amount of nitric acid solution is added to a hydrogen fluoride solution. Alternatively, each portion is immersed in a nitric acid solution diluted to have a weight concentration of approximately 1%, and is then immersed in the hydrogen fluoride solution. Thereafter, the stain film 8 is formed on a side surface of each portion through washing and drying (FIG. 5).

Subsequently, the oxide film 9 is selectively removed with the stain film 8 remaining. One of a nitride oxide film and an oxide film can be removed with the other selectively remaining by using well-known etching conditions. Therefore, the oxide film 9 can be removed selectively.

Consequently, the step shown in FIG. 1 can be implemented. The oxide film 9 is provided such that the stain film 8 is not formed on a junction surface of each of the movable electrode support portions 1b and 1d, the fixed electrodes 2a and 2b and the frame portion 7 with the back side substrate 4.

Then, a metal film 6 is formed over the whole surface of the surface side substrate 3 by using a sputtering method or the like as shown in FIG. 19 in the same manner as in the conventional art after the step shown in FIG. 1 is carried out. Thereafter, the metal film 6 is subjected to patterning by using a photolithographic technique and an etching technique, and is divided into electrode films 6a, 6b and 6c connected to the fixed electrodes 2a and 2b and the movable electrode 1, respectively.

By using the method of manufacturing an acceleration sensor according to the present embodiment, the stain film 8 for reducing bonding adsorption force is formed on the side surfaces of the movable electrode 1, the fixed electrodes 2a and 2b and the frame portion 7. Accordingly, even if the Coulomb force is generated between both electrodes when the silicon substrate and the back side substrate 4 are to be joined by using the anode junction method, it is possible to suppress the bonding between the movable electrode 1 and the fixed electrodes 2a and 2b.

<Second Embodiment>

In a method of manufacturing an acceleration sensor according to the present embodiment, a silicon substrate and a back side substrate are joined together without using an anode junction method such that bonding of a movable electrode and a fixed electrode is not generated. Also in the present embodiment, description will be given by taking, as an example, the structure of the acceleration sensor shown in FIGS. 13 to 16.

Figure 6:
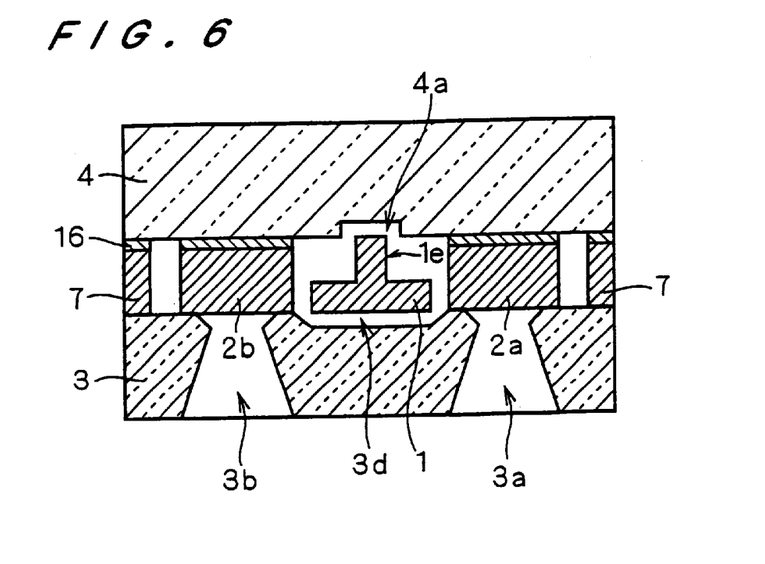
FIGS. 6 to 11 are diagrams showing a method of manufacturing an acceleration sensor according to a second embodiment.

FIG. 6 shows the step of joining a silicon substrate to a back side substrate 4 without using the anode junction method in the method of manufacturing an acceleration sensor according to the present embodiment. Before the state shown in FIG. 6 is obtained, a surface side substrate 3 having contact holes 3a to 3c and a concave portion 3d formed therein and a silicon substrate are joined by using the anode junction method and a movable electrode 1, fixed electrodes 2a and 2b and a frame portion 7 are formed in the silicon substrate in the same manner as in the conventional art. Moreover, the back side substrate 4 having a concave portion 4a formed therein is also prepared.

In FIG. 6, a Ti/Ni (titanium/nickel) layered film 16 capable of joining the backside substrate 4 and fixed electrodes 2a and 2b or a frame portion 7 without voltage application is formed in their junction portion on the back side substrate 4.

When a Ti/Ni layered film is formed on a glass substrate (titanium is on the glass substrate side) and a silicon substrate is provided on the Ti/Ni layered film and is heat treated at a predetermined temperature, silicon atoms and nickel atoms cause an eutectic. By utilizing this condition, the back side substrate 4 and the silicon substrate can be joined without using the anode junction method. Accordingly, it is possible to suppress bonding between the movable electrode 1 and the fixed electrodes 2a and 2b through Coulomb force.

Examples of a material capable of joining a glass substrate to a silicon substrate without the voltage application include a resin-based adhesive, powdered glass (which is melted and bonded by a heat treatment) and the like in addition to the Ti/Ni layered film. For the method of manufacturing an acceleration sensor, however, the temperature of the heat treatment is restricted in the manufacturing process. Therefore, it is hard to employ these materials.

For example, the acceleration sensor shown in FIGS. 13 to 16 uses a glass substrate for the surface side substrate 3 and the back side substrate 4. Therefore, junction should be carried out at such a temperature or less that the glass substrate is started to be melted. Moreover, the heat treatment is carried out up to approximately 400° C. at the subsequent step of forming a metal film 6 or the like. Therefore, it is necessary to set the condition that the junction is not broken at the same temperature. In general, the condition that the junction can be carried out at a temperature of approximately 400 to 500° C. and melting is not generated at a temperature of approximately 400° C. is required for a junction material. The Ti/Ni layered film satisfies the condition, and is suitable for the method of manufacturing an acceleration sensor.

Figure 7:
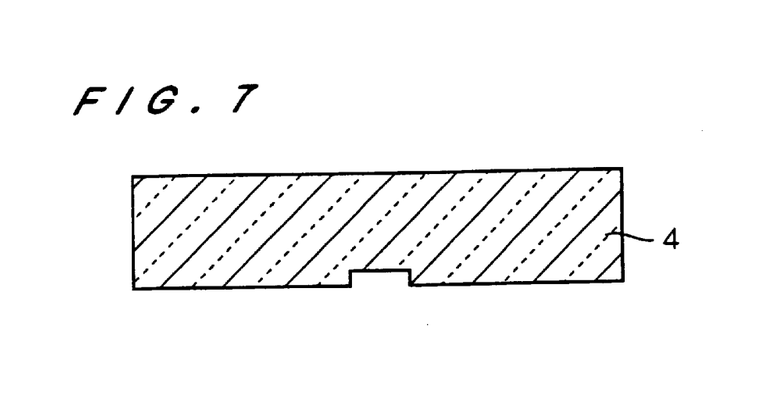
Figure 8:
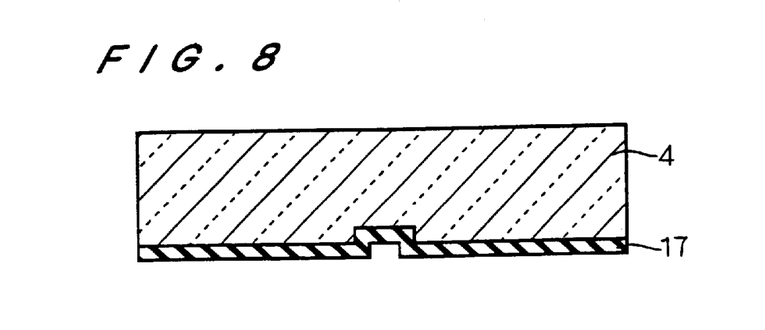
Figure 9:
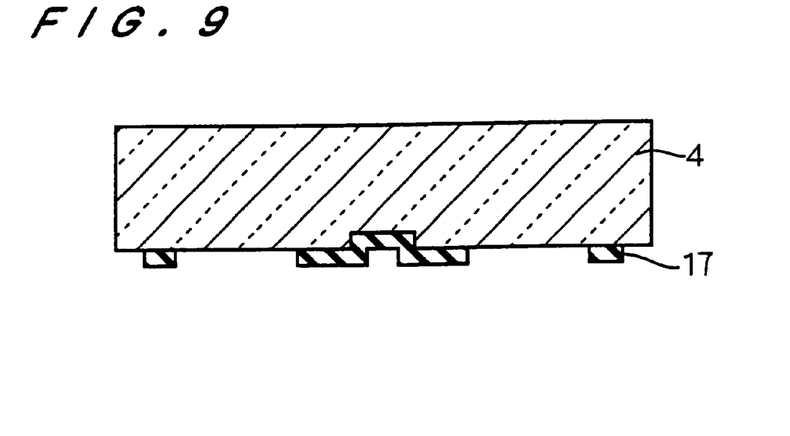

The step of forming the Ti/Ni layered film 16 will be described below in detail with reference to FIGS. 7 to 11. First of all, the back side substrate 4 having the concave portion 4a formed thereon is prepared (FIG. 7). Then, a photoresist 17 is formed on a surface on the side where the silicon substrate is to be joined (FIG. 8), and is subjected to patterning to act as a mask for patterns of the fixed electrodes 2a and 2b and the frame portion 7 (FIG. 9).

Figure 10:
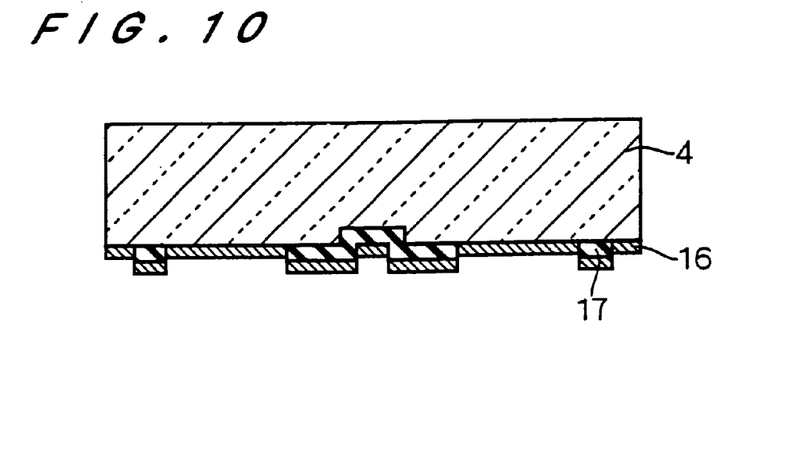

Next, a titanium film and a nickel film are formed on the back side substrate 4 in this order by using a metal deposition method or the like. Thus, the Ti/Ni layered film 16 is formed (FIG. 10).

Figure 11:
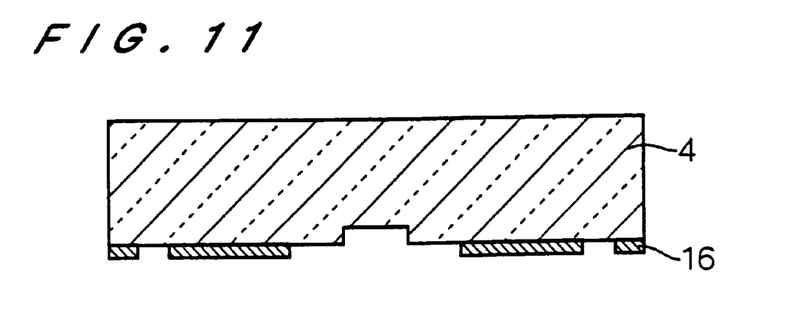

The back side substrate 4 having the Ti/Ni layered film 16 formed thereon is immersed in an acetone solution to which ultrasonic waves are applied. Thus, the Ti/Ni layered film 16 provided on the photoresist 17 is lifted off together with the photoresist 17. Consequently, it is possible to form the Ti/Ni layered film 16 having the same shape as that of each of the fixed electrodes 2a and 2b and the frame portion 7 on the back side substrate 4 without forming the Ti/Ni layered film 16 in a portion corresponding to the arrangement of the movable electrode 1 (FIG. 11).

At the above-mentioned step, acetone is used to remove the photoresist 17 for the following reason. In other words, examples of the method of removing a photoresist generally include a method using a plasma asher and a method using a resist removing solution such as acid based chemicals or organic chemicals. By using these methods, however, a nickel film in the Ti/Ni layered film 16 is corroded so that an eutectic reaction with the silicon substrate is prevented. More specifically, the nickel film is oxidized by using the plasma asher and is dissolved by using the resist removing solution.

On the other hand, acetone can remove the photoresist without corroding the nickel film. Accordingly, the eutectic reaction of the nickel film and the silicon substrate is not prevented. For this reason, acetone is used for removing the photoresist 17.

Moreover, it is preferable that a positive photoresist should be employed for the photoresist 17. The positive photoresist can be dissolved in the acetone differently from the negative photoresist.

Then, a metal film 6 is formed over the whole surface of the surface side substrate 3 by using a sputtering method or the like as shown in FIG. 19 in the same manner as in the conventional art after the step shown in FIG. 6 is carried out. Thereafter, the metal film 6 is subjected to patterning by using a photolithographic technique and an etching technique, and is divided into electrode films 6a, 6b and 6c connected to the fixed electrodes 2a and 2b and the movable electrode 1, respectively.

By using the method of manufacturing an acceleration sensor according to the present embodiment, the Ti/Ni layered film 16 is formed on the junction portion of the back side substrate 4 to the fixed electrodes 2a and 2b and the frame portion 7. Therefore, it is possible to join the back side substrate 4 to the silicon substrate without using the anode junction method.

<Third Embodiment>

In a method of manufacturing an acceleration sensor according to the present embodiment, bonding of a movable electrode and a fixed electrode is not caused by application of the same electric potential to the movable electrode and the fixed electrode when a silicon substrate and a back side substrate are to be joined by using an anode junction method. Also in the present embodiment, description will be given by taking, as an example, the structure of the acceleration sensor shown in FIGS. 13 to 16.

Figure 12:
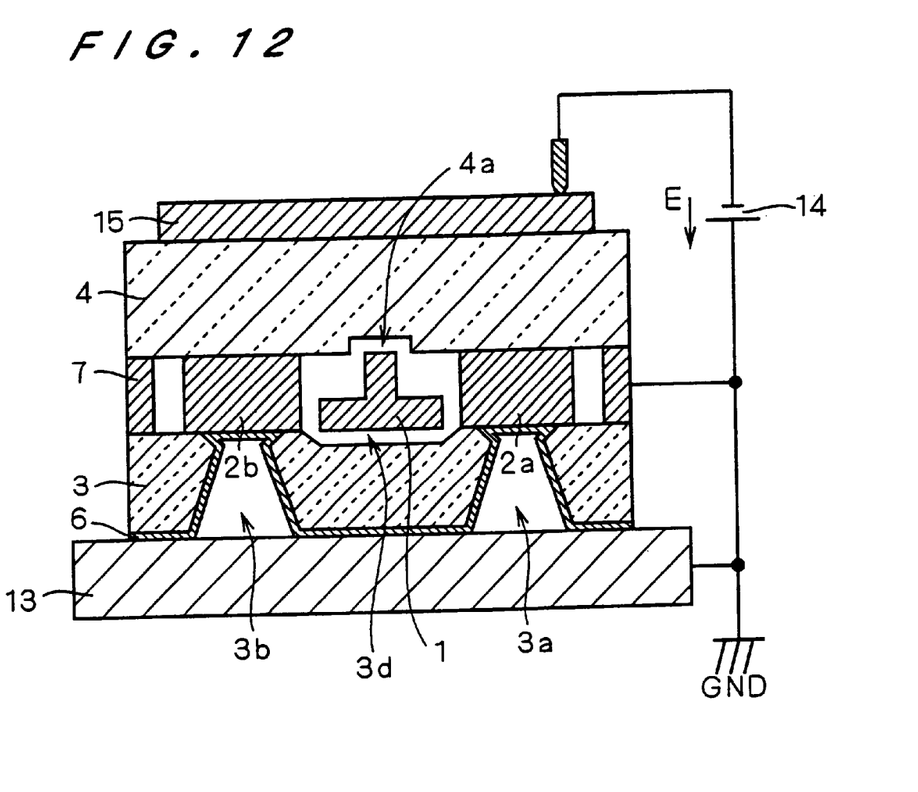
FIG. 12 is a diagram showing a method of manufacturing an acceleration sensor according to a third embodiment.

FIG. 12 shows the step of joining a silicon substrate to a back side substrate 4 by using the anode junction method in the method of manufacturing an acceleration sensor according to the present embodiment. Before the state shown in FIG. 12 is obtained, a surface side substrate 3 having contact holes 3a to 3c and a concave portion 3d formed therein and a silicon substrate are joined by using the anode junction method and a movable electrode 1, fixed electrodes 2a and 2b and a frame portion 7 are formed in the silicon substrate in the same manner as in the conventional art. Moreover, the back side substrate 4 having a concave portion 4a formed therein is also prepared.

In FIG. 12, a metal film 6 has already been formed over the whole surface of the surface side substrate 3 which is opposite to the silicon substrate. More specifically, the metal film 6 is formed on the surface side substrate 3 by using a sputtering method or the like before the junction of the silicon substrate and the back side substrate 4 is carried out. At this time, the metal film 6 is formed sufficiently thickly such that the movable electrode 1 and the fixed electrodes 2a and 2b in the contact holes 3a to 3c can be electrically connected to each other.

Thus, the movable electrode 1 and the fixed electrodes 2a and 2b are conducted through the contact holes 3a to 3c in the state in which the metal film 6 is previously formed over the whole surface of the surface side substrate 3. Accordingly, if the metal film 6 of the surface side substrate 3 is connected to an electrode 13, a ground potential GND is applied to both the movable electrode 1 and the fixed electrodes 2a and 2b. In this state, when the silicon substrate and the back side substrate 4 are joined to each other by using the anode junction method as shown in FIG. 12, the movable electrode 1 and the fixed electrodes 2a and 2b are set to have the same electric potential and the bonding of the movable electrode 1 and the fixed electrodes 2a and 2b is not caused.

When the junction is completed, the metal film 6 is subjected to patterning by using a photolithographic technique and an etching technique and is divided into electrode films 6a, 6b and 6c connected to the fixed electrodes 2a and 2b and the movable electrode 1 respectively as shown in FIG. 20 in the same manner as in the conventional art.

By using the method of manufacturing an acceleration sensor according to the present embodiment, the silicon substrate and the back side substrate 4 are joined by using the anode junction method in the state in which the metal film 6 is previously formed over the whole surface of the surface side substrate 3. Accordingly, the movable electrode 1 and the fixed electrodes 2a and 2b are set to have the same electric potential and the bonding of the movable electrode and the fixed electrode is not caused. Differently from the conventional art, only the order of the steps is exchanged. Therefore, another film does not need to be formed. Consequently, an increase in a cost can be suppressed.

While the invention has been described in detail, the foregoing description is in all aspects illustrative and not restrictive. It is understood that numerous other modifications and variations can be devised without departing from the scope of the invention.

What is claimed is:

1. A method of manufacturing an acceleration sensor comprising the steps of:

(a) preparing first and second insulating substrates and a non-insulating substrate;

(b) providing at least two contact holes on said first insulating substrate;

(c) joining said first insulating substrate to said non-insulating substrate and forming, in said non-insulating substrate, a movable electrode and a fixed electrode which are to be connected to said contact holes respectively by using a photolithographic technique and an anisotropic etching technique;

(d) forming a conductive film on said first insulating substrate and in said contact holes such that said movable electrode and said fixed electrode are conducted through said contact holes;

(e) joining, by an anode junction method, said second insulating substrate to a surface of said non-insulating substrate which is opposite to a surface where said first insulating substrate is joined while applying a predetermined electric potential to said conductive film; and (f) patterning said conductive film to be divided into electrode films connected to said fixed electrode and said movable electrode, respectively.

* * * * *